United States Patent [19]

Oshima et al.

[11] Patent Number: 4,760,578
[45] Date of Patent: Jul. 26, 1988

[54] SEMICONDUCTOR LASER WITH A CONTROLLABLE TRANSMITTANCE LAYER

[75] Inventors: Masaaki Oshima, Yokohama; Noriyuki Hirayama, Kawasaki; Nobuyasu Hase, Atsugi, all of Japan

[73] Assignee: Matsushita Electric Industrial Co., Ltd., Osaka, Japan

[21] Appl. No.: 936,395

[22] Filed: Dec. 1, 1986

[30] Foreign Application Priority Data

Nov. 29, 1985 [JP] Japan .................. 60-269739

[51] Int. Cl.$^4$ ............................................. H01S 3/19
[52] U.S. Cl. ............................... 372/45; 372/46; 372/49; 372/50; 372/108
[58] Field of Search ............... 372/44, 45, 46, 49, 372/50, 23, 108

[56] References Cited

U.S. PATENT DOCUMENTS

| | | | |
|---|---|---|---|
| 3,996,528 | 12/1976 | Blum et al. | 372/44 |
| 4,053,914 | 10/1977 | Goodwin | 372/45 |
| 4,216,485 | 6/1980 | Page | 372/50 |
| 4,633,476 | 12/1986 | Scifres et al. | 372/108 |

OTHER PUBLICATIONS

"Stable Longitudinal-Mode InGaAsP/InP Internal-Reflection-Interference Laser" by Masaaki Oh-shima et al; IEEE Journal of Quantum Electronics, vol. Qe-21, No. 6, Jun. 1985, pp. 563–567.

Dupuis et al., "Room-Temperature Operation of Distributed-Bragg-Confinement Ga$_{1-x}$Al$_x$As-GaAs Laser Grown by Metalorganic Chemical Vapor Deposition".

Primary Examiner—James W. Davie
Assistant Examiner—Georgia Y. Epps
Attorney, Agent, or Firm—Lowe, Price, LeBlanc, Becker & Shur

[57] ABSTRACT

In a semiconductor laser, an active layer and a pair of cladding layers sandwiching therebetween the active layer are provided to be parallel to the plane of the substrate to form a light waveguide passage, and light from the light waveguide passage is guided toward the substrate by reflecting the same at reflecting layers formed of dielectric with the active layer and the cladding layers being cut to have slopes inclined at approximately 45 degrees with respect to the plane of the substrate. A multiquantum well layer is provided so as to change the transmittance thereof by the change of applied electric field providing extremely high speed modulation. One or more through-holes may be made in the substrate so as to derive output light therethrough. One or more of the through-holes may be filled with a reflection layer so as to selectively reflect particular wavelength light, and thus by using a plurality of such laser chips, oscillation at different wavelengths is possible.

16 Claims, 3 Drawing Sheets

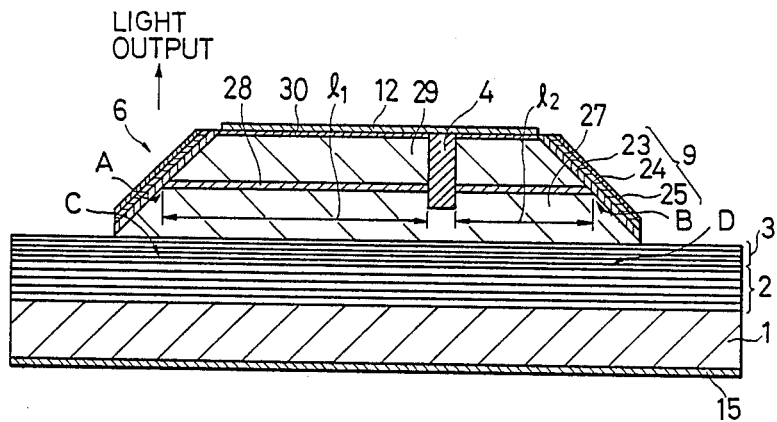
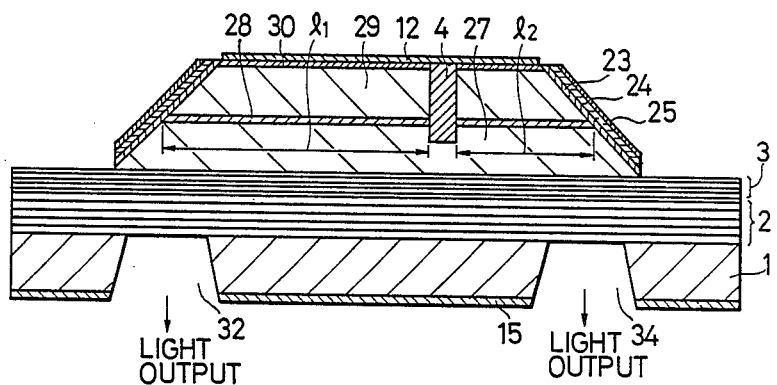
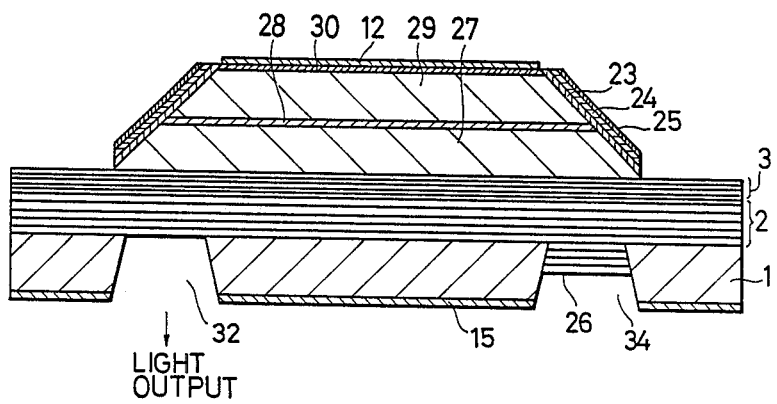

WAVELENGTH 1.3μm

WAVELENGTH 1.298μm

WAVELENGTH 1.302μm
WAVELENGTH

SEMICONDUCTOR LASER WITH A CONTROLLABLE TRANSMITTANCE LAYER

BACKGROUND OF THE INVENTION

This invention relates generally to semiconductor lasers and more particularly to such a laser which can be used as a light source suitable for optical communication using multiwavelength light signal.

Conventional trunk circuit amplifiers for multiwavelength light signal splits signal light, which is formed by multiplexing n carrier waves each having different wavelength from another, into an n beams so that respective photodetectors are used to receive different wavelength light rays thereby electrically amplifying to convert into light of different wavelengths. As a result, entire structure is complex, and when increasing the degree of multiplex, scale of junction becomes larger and larger increasing the number of parts which would result in the deterioration in reliability. Furthermore, in order to reproduce light, which has been modulated at a very high speed, it is necessary that characteristics of respective semiconductor devices and electric parts and all the high frequency characteristics are satisfactory. This would result in increase in cost.

SUMMARY OF THE INVENTION

The present invention has been developed in order to remove the above-described drawbacks inherent in the conventional semiconductor laser.

It is, therefore, an object of the present invention to provide a new and useful semiconductor laser which is capable of amplifying light signal without photoelectric transfer and which can be formed as an integrated circuit so that not only light amplification but also extremely high speed modulation is possible using only a single device.

According to a feature of the present invention an active layer and a pair of cladding layers sandwiching therebetween the active layer are provided to be parallel to the plane of the substrate to form a light waveguide passage, and light from the light waveguide passage is guided toward the substrate by reflecting the same at reflecting layers formed of dielectric with the active layer and the cladding layers being cut to have slopes inclined at 45 degrees with respect to the plane of the substrate.

According to another feature of the present invention, a multiquantum well layer is provided so as to change the transmittance thereof by the change of applied electric field. More specifically, the loss of a resonator forming a laser is changed by way of electric field rather than by carrier injection which is a conventional modulation method, to thereby achieving extremely high speed modulation. Thus, in the present invention, the transmittance of multiquantum well structure is changed by changing applied electric field. As a result, oscillating condition depends on the loss of the resonator due to the electric field providing extremely high speed modulation.

According to another feature of the present invention, in order to emit light of different wavelengths, reflection portion having refractive index smaller than that of the active layer is formed in the middle of the active layer. The position of the reflection portion is selected so as to divide the entire length l of the active layer to l1 and l2 and an oscillating center frequency can be determined by l, l1-l2 and by the gain distribution of the laser. Similarly, second and third oscillating center frequencies can be determined by l', l1' and l2' and by l'', l1'' and l2'' and by gain distribution of the laser.

According to another feature of the present invention, output light may be derived from the slopes by selecting the reflectivity of various reflection layers, and also from the bottom side of the laser by making one or more through-holes in the through-hole and also selecting the reflectivity of the reflection layers on the slope.

According to another feature of the present invention, one of the above-mentioned through-holes may be filled with a further reflection layer having selective reflectivity against a particular wavelength.

According to a further feature of the present invention, when a plurality of laser chips each having the above-mentioned through-holes one of which is filled with the above-mentioned further reflection layer, are integrated such that the particular wavelength differs from another, then three light rays of different wavelengths can be selectively obtained by selectively energizing one of the integrated chips.

In accordance with the present invention there is provided a semiconductor laser of refractive index waveguide type: comprising: a substrate; a light waveguide passage formed of an active layer and cladding layers which are formed above said substrate; and a resonator including reflection portions formed by cutting both ends of said active layer and said cladding at an angle of from 40 to 50 degrees with respect to the plane of said substrate, and a reflection portion formed on said substrate.

BRIEF DESCRIPTION OF THE DRAWINGS

The object and features of the present invention will become more readily apparent from the following detailed description of the preferred embodiments taken in conjunction with the accompanying drawings in which:

FIG. 2 is a cross-sectional view taken along a line II—II in FIG. 1;

FIG. 3 is a cross-sectional view partially showing a second embodiment laser according to the present invention;

FIG. 4 is a cross-sectional view partially showing a third embodiment laser according to the present invention.

The same or corresponding elements and parts are designated at like reference numerals throughout the drawings.

DETAILED DESCRIPTION OF THE INVENTION

First Embodiment

Figure 1:
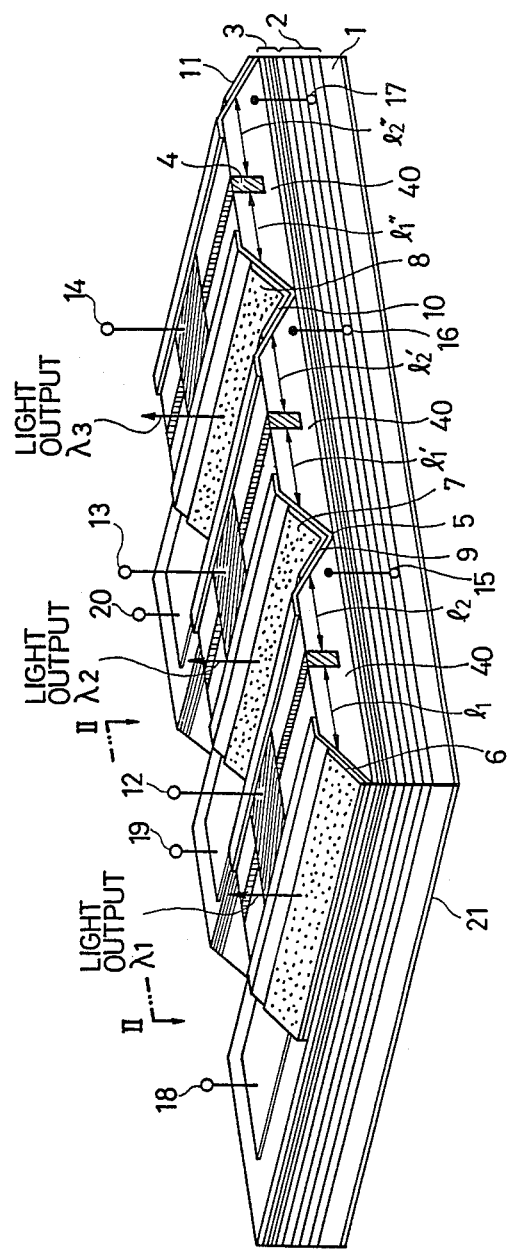
FIG. 1 is a schematic perspective view of a first embodiment of the laser according to the present invention.

Referring now to FIG. 1, a schematic perspective view of an integrated multiwavelength semiconductor laser according to the present invention is shown. In FIG. 1, on n-InP (100) oriented substrate 1 are grown through epitaxial growth n-Inp and n-InGaAsP-(Eg=1.0 eV) layers alternately so that 40 pairs thereof are formed. This portion is used as a reflection layer 2. It was confirmed using a spectrophotometer that the 40 pairs of the InP and InGaAsP layers exhibit an extremely high reflectivity against a wavelength around 1.3 micrometer. On the reflection layer 2 are grown continuously n-InGaAsP (Eg=1.18 eV; thickness of 280 Å) and n-InGaAsP (Eg=1.0 eV; thickness of 120 Å) layers alternately so that 20 pairs thereof are formed. This portion is a so-called multiquantum well layer and operates as a light modulation layer 3. This multiquantum well layer 3 or light modulation layer is used for varying transmittance thereof by the change of applied electric field. However, in the case such change in transmittance is not required, this multiquantum well layer 3 may be omitted so that the following layers are directly formed on the above-mentioned reflection layer 2.

On the light modulation layer 3 is formed a so-called BC-IRI (Burried Crescent-Internal Reflection-Interference) laser described in IEEE Journal of Quantum Electronics, QE-26, PP563-567, 1985 by M. Ohshima et al. More specifically, a current-blocking layer 40 having n-InP, p-InP, n-InP and n-InGaAsP is grown first, and then a channel having a width of approximately 2 micrometers is formed by photoetching. At this time, a portion of the channel is mask etched so that a notch of InP remains. This notch is shown in FIG. 1 at a reference 4. On a wafer having such a groove extending in a direction (011) parallel to the plane of the substrate 1, are grown n-InP cladding layer 27, n-InGaAsP (Eg=0.95 eV) active layer 28, p-InP cladding layer 29 and p-InGaAsP layer 30 (Eg=1.0 eV) successively. The above-mentioned current blocking layer 40 is not shown in a cross-sectional view of FIG. 2 because the cross-section is taken along the channel or groove where the above mentioned layers 27-30 are formed.

Then, grooves 5 are formed through RIE (Reactive Ion Etching) or wet chemical etching so that slopes defining each groove 5 makes 45° with respect to the plane of the substrate 1. This angle may be a value from 40 to 50 degrees. Masking for forming such grooves 5 is designed so that the lengths of the active layers 28 (other two active layers are not shown) are as follows: $l1+l2=200$ μm, $l1-l2=70$ μm, $l1'+l2'=220$ μm, $l1'-l2'=75$ m, $l1''+l2''=250$ μm, $l1''-l2''=80$ μm.

After the grooves 5 are formed, multilayer coating of SiO2 and Si is effected to form a group of reflection layers 6, 7 and 8 and another group of reflection layers 9, 10 and 11. More specifically, the slopes defining the grooves 5 are covered by reflection surfaces 6-8 which are used as light emitting portion and, by reflection surfaces 9-11 respectively. The reflectivity of the above-mentioned two groups of reflection layers 6-8 and 9-11 are respectively determined so that reflection layers 6-8 show reflectivity of 60 percent and the reflection layers 9-11 show reflectivity of 85 percent.

Then positive ohmic electrodes 12, 13 and 14, negative ohmic electrodes 15, 16 and 17, and control electrodes 18, 19 and 20 are respectively provided. Meanwhile, an electrode 21 is attached to the lower surface of the substrate 1. Although the electrodes 15-17 are shown as wires, these electrodes are actually flat electrodes each attached to an upper surface of the exposed cladding layer 27 which is just above the modulation layer 3. The device comprising integrated three laser chips or elements is mounted on a heat sink and when electrodes 12, 13 and 14 and electrodes 15, 16 and 17 are independently supplied with power, single mode oscillation spectrum is observed at the slopes or the light-emitting portions 6, 7 and 8. More specifically, analyzing the operation in one laser chip shown in FIG. 2, in the laser according to the present invention, oscillation occurs at a resonator which is formed of the active layer 28, inclined end surfaces A and B of the active layer 28, and the semiconductor multilayer reflecting layer 2. The references C and D indicate areas of the semiconductor multilayer reflection layer 2 which areas are positioned below the inclined end surfaces A and B to be used for reflection of light from the inclined end surfaces A and B. In other words, light emitted from the inclined end surfaces A and B of the active layer 28 is first reflected at the reflection layers 6 and 9 as best seen in FIG. 2, to be directed downward in the drawing, and is then reflected at the areas C and D to be returned so as to be emitted outside through the reflection layer 6. Assuming that oscillation spectrums in the respective elements are given by λ1, λ2 and λ3, the difference between λ1 and λ2 and the difference between λ2 and λ3 are both approximately 20Å, and this difference is caused from the difference in parameter of internal reflection interference.

When applying a voltage of approximately 30V to the electrodes 18, 19 and 20 with respect to the electrode 21, the transmittance at the modulation layer 3 lowers from approximately 85 percent to 65 percent, increasing the loss of the resonator to thereby interrupt oscillation. Since the variation of the transmittance due to electric field is caused from exciton, the moving velocity is extremely high such that a value which is approximately three times that in conventional direct modulation can be obtained. The voltage applied to the electrodes 18, 19 and 20 is controlled to give bias so that the laser assumes a state which is just before oscillation. After this, when introducing laser light having wavelengths respectively corresponding to λ1, λ2 and λ3, then amplified light outputs can be derived from the light emitting portions 6, 7 and 8.

SECOND EMBODIMENT

FIG. 3 shows partially a second embodiment laser according to the present invention. The second embodiment differs from the first embodiment in that through-holes 32 and 34 are formed in the substrate 1 at positions below the portions C and D shown in FIG. 2. With the provision of the through-holes 32 and 34 light output can be derived from the bottom side of the laser. In order to derive all the light output from the bottom side of laser, three layers are formed on the surface of each of the slopes defining the grooves 5. More specifically a SiO2 layer 23 having a thickness of 2300 Å, a Si layer 24 having a thickness of 930 Å and a Au layer 25 having a thickness of 3000 Å are formed in sequence so as to provide reflectivity close to 100 percent. On the other hand, the reflection layer 2 comprises only 10 pairs of the same layers of the first embodiment so as to reduce the reflectivity to approximately 40 percent. As a result, high output is resulted. As three similar elements or chips are integrated to form a single laser device to be energized, a single longitudinal mode oscillation at wavelengths intervals of 20 Å is was observed. In addition, when electric field is applied to the modulation layer 3 in the oscillating state, interruption of oscillation is observed. Therefore, it has been confirmed that modulation is available.

THIRD EMBODIMENT

Reference is now made to FIG. 4 showing partially a third embodiment laser in cross-section in a manner similar to FIG. 2. The third embodiment is a modification of the above-described second embodiment and differs from the same in that one of the through-holes 32 and 34 made in the substrate 1 is partially filled with a dielectric multilayer 26 and in that the notch 4 is not formed. This dielectric multilayer 26 is formed of five pairs of alternate layers of SiO2 and Si3N4 through CVD method. More specifically, SiO2 having a refractive index of approximately 1.4 and Si3N4 having a refractive index of approximately 2 are used such that the former has a thickness of 2250 Å and the latter has a thickness of 1630 Å which respectively correspond to $\lambda/4n$ wherein n is refractive index.

Figure 5A:
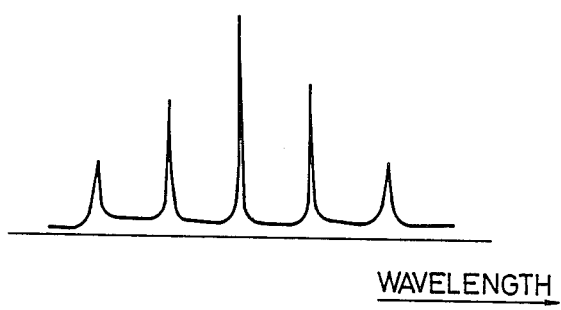
FIGS. 5A to 5D are spectrum diagrams for the description of the third embodiment.

In this embodiment, since the band gap of the active layer 28 is Eg=0.9 eV, oscillation wavelength is approximately 1.3 micrometers. In the absence of the dielectric multilayer 26 four peaks are observed at an interval of approximately 10 Å around the center wavelength of 1.3 micrometer as shown in FIG. 5A. This is so-called multimode operation. With the provision of the dielectric multilayer 26 having the above-described structure, the multilayer 26 shows high reflectivity against wavelength of 1.3 micrometers. In other words, the dielectric multilayer 26 absorbs light of wavelengths other than 1.3 micrometers so that only 1.3 micrometer wavelength light is reflected to perform single longitudinal mode oscillation. As a result, such a single longitudinal mode oscillation light is outputted from the other through-hole 32.

Figure 5B:
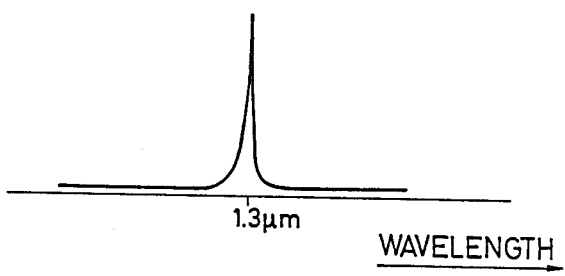
Figure 5C:
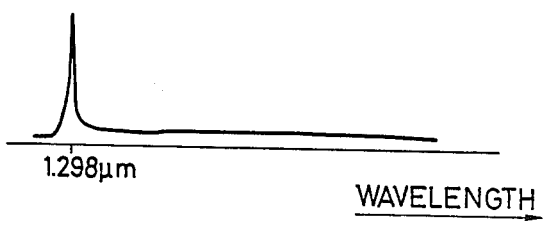
Figure 5D:
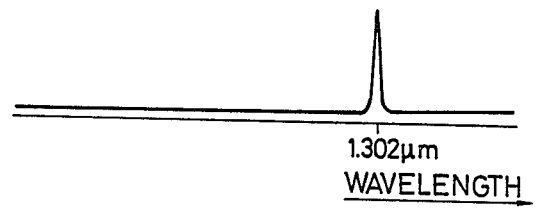

FIG. 5B shows a spectrum of the output light from the through-hole 32. It is to be noted that when the thickness of each of the SiO2 layers forming the dielectric multilayer 26 is changed to given values, the oscillating wavelength varies as follows: In the case of the thickness of 1200 Å of the SiO2 layers, a single axial mode oscillation is observed around a wavelength of 1.298 micrometers as shown in FIG. 5C. Furthermore, in the case of the thickness of 1800 Å, oscillation light output is obtained having a peak around a wavelength of 1.302 micrometers as shown in FIG. 5D.

In this way, two or more laser elements or chips having different oscillating wavelengths may be combined or integrated. For instance, when three chips having the above-mentioned different wavelengths are integrated in a manner similar to FIG. 1, then we can obtain a laser device which is capable of oscillating at three different wavelengths. A suitable switch may be provided for selectively energizing one of the three chips to obtain single mode oscillation at a desired wavelength. In addition, when an electric field is applied to the modulating layer 3, then oscillation at the laser chip can be interrupted. Therefore, it is possible to modulate the oscillating light by the application of such an electric field.

The above-described embodiments are just examples of the present invention, and therefore, it will be apparent for those skilled in the art that many modifications and variations may be made without departing from the scope of the present invention.

What is claimed is:

1. In a semiconductor laser of refractive index waveguide type having a substrate; and a light waveguide passage formed of a first cladding layer formed on said substrate, an active layer formed on said first cladding layer, and a second cladding layer formed on said active layer wherein the improvement comprises:

(a) a reflection layer formed of semiconductors which are deposited on said substrate; and (b) a resonator including reflection portions formed by cutting both ends of said light waveguide passage at an angle of from 40 to 50 degrees with respect to the plane of said substrate, and said reflection layer formed on said substrate.

2. A semiconductor laser of refractive index waveguide type, comprising:

(a) a substrate;
   (b) a first reflection layer formed of semiconductors which are deposited on said substrate;
   (c) a multiquantum well layer formed on said first reflection layer;
   (d) a first cladding layer formed on said multiquantum well layer, said first cladding layer covering an upper surface of said multiquantum well layer partially so that a portion of said upper surface of said multiquantum well layer is exposed;
   (e) an active layer formed on said first cladding layer, said active layer covering an upper surface of said first cladding layer partially so that a portion of said upper surface of said first cladding layer is exposed;
   (f) a second cladding layer formed on said first cladding layer to interpose said active layer between said first and second cladding layers;
   said first and second cladding layers and said active layer being cut at their both ends which are substantially perpendicular to said first edge of said first cladding layer at an angle of from 40 to 50 degrees with respect to the plane of said substrate to form first and second slopes so that cross-section of these three layers has a trapezoidal shape such that a lower surface of said first cladding layer is larger than an upper surface of said cladding layer;
   (g) second and third reflecting layers respectively formed on said first and second slopes;
   said active layer and said first, second and third reflection layers forming a resonator for oscillating said layer;
   (h) first and second electrodes respectively attached to said exposed upper surface of said first cladding layer and second cladding layer for energizing said layer; and
   (i) third and fourth electrodes respectively attached to an upper surface of said multiquantum well layer not covered by said first cladding layer and to said substrate for applying an electric field to said multiquantum well layer to thereby change the transmittance thereof.

3. A semiconductor laser as claimed in claim 2, wherein each of said second and third reflection layers comprises two dielectric layers having different refractive indexes.

4. A semiconductor laser as claimed in claim 2, wherein said first reflection layer is of a multilayer structure of a given number of pairs of dielectric layers having different refractive indexes.

5. A semiconductor laser as claimed in claim 2, further comprising a notch and a fourth reflection layer formed in said notch, said fourth reflection layer having a refractive index smaller than that of said active layer, said notch being positioned so as to divide said active layer into two parts and formed before said second electrode is attached.

6. A semiconductor laser as claimed in claim 2, wherein a through-hole is made in said substrate for deriving output light, said through-hole being positioned below one of said first and second slopes, said second and third reflection layers being arranged to have a reflectivity close to 100 percent.

7. A semiconductor laser as claimed in claim 2, wherein a first through-hole is made in said substrate for deriving output light, said first through-hole being positioned below said first slope, and a second through-hole is made in said substrate below said second slope, said second through-hole being partially filled with a fourth reflection layer, said second and third reflection layers being arranged to have a reflectivity close to 100 percent.

8. A semiconductor laser as claimed in claim 7, wherein said fourth reflection layer comprises a given number of pairs of dielectric layers having different refractive indexes.

9. A semiconductor laser of refractive index waveguide type having a plurality of laser chips which are integrated, each of said chips comprising:
(a) a substrate;
(b) a first reflection layer formed of semiconductors which are deposited on said substrate;
(c) a multiquantum well layer formed on said first reflection layer, said substrate, first reflection layer and multiquantum well layer being common to said at least two laser chips;
(d) a first cladding layer formed on said multiquantum well layer, said first cladding layer covering an upper surface of said multiquantum well layer partially so that a portion of said upper surface of said multiquantum well layer is exposed;
(e) an active layer formed on said first cladding layer, said active layer covering an upper surface of said first cladding layer partially so that a portion of said upper surface of said first cladding layer is exposed;
(f) a second cladding layer formed on said first cladding layer to interpose said active layer between said first and second cladding layers;
said first and second cladding layers and said active layer being cut at their both ends which are substantially perpendicular to said first edge of said first cladding layer at an angle of from 40 to 50 degrees with respect to the plane of said substrate to form first and second slopes so that cross-section of these three layers has a trapezoidal shape such that a lower surface of said first cladding layer is larger than an upper surface of said second cladding layer;
(g) second and third reflection layers respectively formed on said first and second slopes;
said active layer and said first, second and third reflection layers forming a resonator for oscillating said laser;
(h) first and second electrodes respectively attached to said exposed upper surface of said first cladding layer and second cladding layer for energizing said laser; and
(i) third and fourth electrodes respectively attached to an upper surface of said multiquantum well layer not covered by said first cladding layer and to said substrate for applying an electric field to said multiquantum well layer to thereby change the transmittance thereof.

10. A semiconductor laser as claimed in claim 9, wherein each of said second and third reflection layers comprises two dielectric layers having different refractive indexes.

11. A semiconductor laser as claimed in claim 9, wherein said first reflection layer is of a multilayer structure of a given number of pairs of dielectric layers having different refractive indexes.

12. A semiconductor laser as claimed in claim 9, further comprising a notch and a fourth reflection layer formed in said notch, said fourth reflection layer having a refractive index smaller than that of said active layer, said notch being positioned so as to divide said active layer into two parts and formed before said second electrode is attached.

13. A semiconductor laser of refractive index waveguide type having a plurality of laser chips which are integrated, each of said chips comprising:
(a) a substrate;
(b) a first reflection layer formed of semiconductors which are deposited on said substrate;
(c) a multiquantum well layer formed on said first reflection layer, said substrate, first reflection layer and multiquantum well layer being common to said at least two laser chips;
(d) a first cladding layer formed on said multiquantum well layer, said first cladding layer covering an upper surface of said multiquantum well layer partially so that a portion of said upper surface of said multiquantum well layer is exposed;
(e) an active layer formed on said first cladding layer, said active layer covering an upper surface of said cladding layer partially so that a portion of said upper surface of said first cladding layer is exposed;
(f) a second cladding layer formed on said first cladding layer to interpose said active layer between said first and second cladding layers;
said first and second cladding layers and said active layer being cut at their both ends which are substantially perpendicular to said first cladding layer at an angle of from 40 to 50 degrees with respect to the plane of said substrate to form first and second slopes so that cross-section of these three layers has a trapezoidal shape such that a lower surface of said first cladding layer is larger than an upper surface of said second cladding layer;
(g) second and third reflection layers respectively formed on said first and second slopes;
said active layer and said first, second and third reflection layers forming a resonator for oscillating said laser;
(h) first and second electrodes respectively attached to said exposed upper surface of said first cladding layer and second cladding layer for energizing said laser; and
(i) third and fourth electrodes respectively attached to an upper surface of said multiquantum well layer not covered by said first cladding layer and to said substrate for applying an electric field to said multiquantum well layer to thereby change the transmittance thereof;
a first through-hole being made in said substrate for deriving output light, said first through-hole being positioned below said first slope, and a second through-hole being made in said substrate below said second slope, said second through-hole being partially filed with a fourth reflection layer comprising a given number of pairs of dielectric layers having different refractive indexes, the thickness of one of said dielectric layers in each pair being changed throughout said plurality of laser chips so as to reflect particular wavelength light, said second and third reflection layers being arranged to have a reflectivity close to 100 percent.

14. A semiconductor laser as claimed in claim 13, wherein each of said second and third reflection layers comprises two dielectric layers having different refractive indexes.

15. A semiconductor laser as claimed in claim 13, wherein said first reflection layer is of a multilayer structure of a given number of pairs of dielectric layers having different refractive indexes.

16. A semiconductor laser as claimed in claim 13, further comprising a notch and a fourth reflection layer formed in said notch, said fourth reflection layer having a refractive index smaller than that of said active layer, said notch being positioned so as to divide said active layer into two parts and formed before said second electrode is attached.

* * * * *